(12) United States Patent
Ledentsov et al.

(10) Patent No.: US 10,121,935 B2
(45) Date of Patent: Nov. 6, 2018

(54) THREE-DIMENSIONAL SEMICONDUCTOR NANOHETEROSTRUCTURE AND METHOD OF MAKING SAME

(71) Applicant: VI Systems GmbH, Berlin (DE)

(72) Inventors: Nikolay Ledentsov, Berlin (DE); Vitaly Shchukin, Berlin (DE)

(73) Assignee: VI SYSTEMS GMBH, Berlin (DE)

( * ) Notice: Subject to any disclaimer, the term of this patent is extended or adjusted under 35 U.S.C. 154(b) by 0 days.

(21) Appl. No.: 13/753,844

(22) Filed: Jan. 30, 2013

(65) Prior Publication Data

US 2018/0233624 A1    Aug. 16, 2018

Related U.S. Application Data

(60) Provisional application No. 61/633,013, filed on Feb. 3, 2012.

(51) Int. Cl.
| | | |
|---|---|---|
| *H01L 21/00* | (2006.01) | |
| *H01L 33/04* | (2010.01) | |
| *H01S 5/34* | (2006.01) | |
| *H01S 5/32* | (2006.01) | |
| *H01S 5/22* | (2006.01) | |
| *H01L 33/00* | (2010.01) | |

(52) U.S. Cl.
CPC .......... *H01L 33/04* (2013.01); *H01L 33/0062* (2013.01); *H01S 5/2228* (2013.01); *H01S 5/3201* (2013.01); *H01S 5/3216* (2013.01); *H01S 5/341* (2013.01)

(58) Field of Classification Search
CPC .. H01S 5/2027; H01S 5/18302; H01S 5/1833; H01S 5/1021; H01S 5/18341; H01S 5/0265; H01S 5/14; H01S 5/3211; H01S 5/1032; H01S 5/105; H01S 5/18311; H01S 5/0607; H01S 5/183; H01S 2301/166

See application file for complete search history.

(56) References Cited

U.S. PATENT DOCUMENTS 6,521,324 B1 *   2/2003   Debe ................. B41M 5/38207
                                                            156/235
2010/0127287 A1 *  5/2010  Mao ..................... B82Y 10/00
                                                            257/98

\* cited by examiner

*Primary Examiner* — Robert Bachner
(74) *Attorney, Agent, or Firm* — Gordon Rees Scully Mansukhani, LLP

(57) ABSTRACT

A method for fabrication of three-dimensional nanostructures on top of the surface of a first solid state material is disclosed, which includes steps of (i) deposition of a layer of a second solid state material forming a stable layer-like coverage of the surface, (ii) the subsequent deposition of a third solid state material, having a stronger binding energy with the first solid state material than the second solid state material, (iii) wherein the third solid state material replaces the second solid state material forming an interface with the first material and thus reduces the energy of the system, and (iv) where the resulting excess second solid state material forms three-dimensional nanostructures. The structure can be covered with another (fourth) solid state material, which eventually can be the same as the first material or a different one, and the three dimensional nanostructures form capped quantum dots or quantum wires. The deposition steps can be repeated and extended to provide necessary functionality in the resulting device structure.

14 Claims, 9 Drawing Sheets

(a)

(b)

(c)

(d)

(a)

(b)

(c)

(a) 760

(b) 770

(c) 780

(a)

(b)

(c)

(d)

THREE-DIMENSIONAL SEMICONDUCTOR NANOHETEROSTRUCTURE AND METHOD OF MAKING SAME

REFERENCE TO RELATED APPLICATIONS

This application claims an invention which was disclosed in Provisional Application No. 61/633,013, filed Feb. 3, 2012, entitled "Three-Dimensional Semiconductor Nanoheterostructure and Method of Making Same". The benefit under 35 USC § 119(e) of the United States provisional application is hereby claimed, and the aforementioned application is hereby incorporated herein by reference.

BACKGROUND OF THE INVENTION

Field of the Invention

The invention pertains to the field of semiconductor devices. More particularly, the invention pertains to fabricating of quantum dot and quantum wire structures for semiconductor device applications.

Description of Related Art

Quantum Dot (QD) and quantum wire (QWW, abbreviation from "quantum well wire") heterostructures are presently broadly used in multiple applications, particularly in the field of electronic and opto-electronic devices. In the field of light-emitting devices QDs allow extending the spectral range of the devices using the same substrates, allowing growth of epitaxial structures for light-emitting devices on severely lattice-mismatched substrates, and creating novel devices such as intra-level infrared emitters and detectors. QDs improve the high-speed performance of the devices, for example, mode-locked lasers and allow exploring fundamentally new quantum phenomena like single photon emission of Coulomb blockade to be applied in continuously shrinking nanoelectronic devices.

In semiconductor lasers and light emitting diodes the most widely used approach for formation of QD heterostructures is Stranski-Krastanow growth (a review of the formation of QD heterostructures in the Stranski-Krastanow growth mode can be found in the review paper by V. Shchukin et al. "Spontaneous ordering of nanostructures on crystal surfaces", Review of Modern Physics, volume 71, issue 4, pages 1125-1171, July 1999, which is herein incorporated by reference). In the Stranski-Krastanow growth mode, a semiconductor layer (for example, InAs) lattice-mismatched to the single crystalline substrate (for example, GaAs) is initially formed. This layer is stable until some critical thickness is reached. At this thickness the strain energy accumulated in the layer becomes significant and it becomes energetically favorable for the material to relax elastically by forming three-dimensional islands on the surface. The energy benefit due to elastic energy relaxation of the three-dimensional (3D) islands exceeds the energy loss due to excess surface related to the islands. Once the islands are formed they may grow in size to reduce the surface area by ripening or coalescence. Elastic stress relaxation at the edges of the islands and the relaxation-reduced modification of the surface energy may slow down the ripening process and/or lead to the formation of a thermodynamically stable island distribution in sizes, wherein such island distribution does not ripen further. However, any defect on the surface or inside an island, for example, inevitable steps and step bunches can break the size stabilization and result in formation of large three-dimensional islands (that can also be termed clusters) which undergo plastic relaxation and thus are dislocated, i.e. contain defects deteriorating the device performance. Defect reduction techniques have been introduced to improve the crystalline quality in such structures which can be found in the patent "SEMICONDUCTOR DEVICE AND METHOD OF MAKING SAME" U.S. Pat. No. 6,653,166, filed May 9, 2001, issued Nov. 23, 2003, by N. Ledentsov, one of the inventors of the present invention, and in the patent "DEFECT-FREE SEMICONDUCTOR TEMPLATES FOR EPITAXIAL GROWTH AND METHOD OF MAKING SAME", U.S. Pat. No. 6,784,074, filed Jun. 6, 2003, issued Aug. 31, 2004, by the inventors of the present invention, which are herein incorporated by reference. However, as a broad range of crystalline defects can be formed, a significant portion of defects may still remain and adversely affect the performance of the devices based on quantum dots. Thus there exists a strong motivation to find a way of fabrication of quantum dot and quantum wire nanostructures in an approach alternative to conventional Stranski-Krastanow growth.

SUMMARY OF THE INVENTION

A method for fabrication of three-dimensional nanostructures on top of the surface of a first solid state material is disclosed, which includes steps of (i) deposition of a layer of a second solid state material forming a stable layer-like coverage of the surface, (ii) the subsequent deposition of a third solid state material, having a stronger binding energy with the first solid state material than the second solid state material, (iii) wherein the third solid state material replaces the second solid state material forming an interface with the first material and thus reduces the energy of the system, and (iv) where the resulting excess second solid state material forms three-dimensional nanostructures. The structure can be covered with another (fourth) solid state material, which eventually can be the same as the first material or a different one, and the three dimensional nanostructures form capped quantum dots or quantum wires. The deposition steps can be repeated and extended to provide necessary functionality in the resulting device structure.

Figure 1:
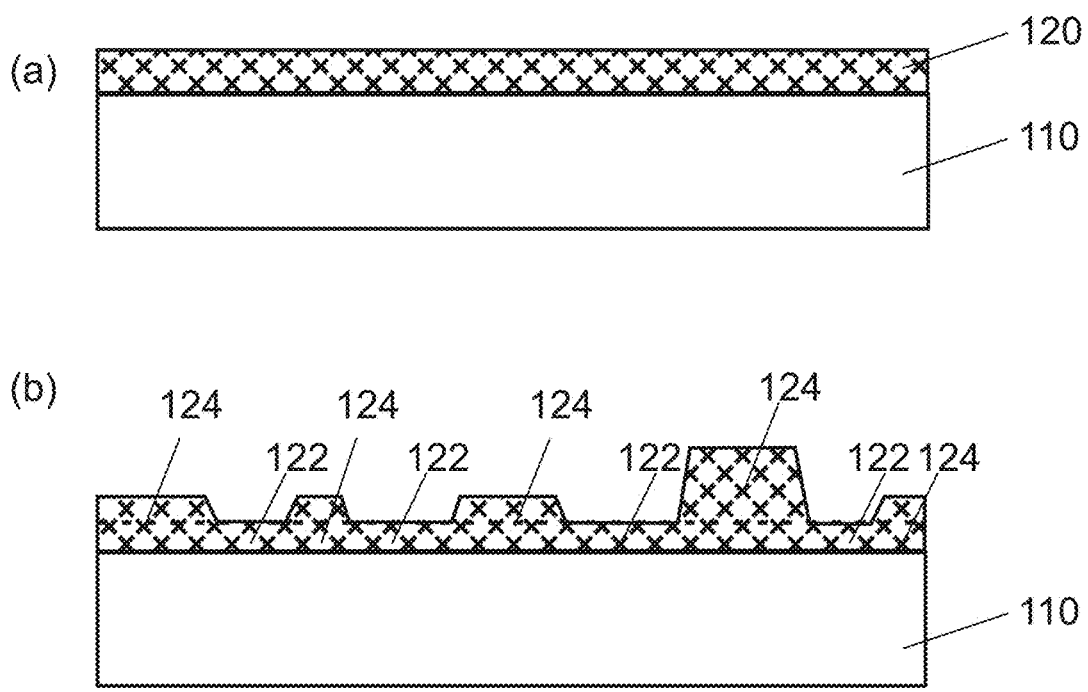
FIG. 1

Prior art: Stranski-Krastanow growth. (a) Layer growth of an epitaxial material lattice-mismatched to the underlying substrate material, (b) once the critical thickness is reached, 3D islands become energetically favorable and form on top of the residual wetting layer and some islands may undergo ripening.

FIG. 2

Prior art: Stranski-Krastanow growth. (a) Layer growth of an epitaxial material lattice-mismatched to the underlying substrate material and having a thickness below the critical one remains stable (b) after being capped with the substrate material. As opposite once the critical thickness is reached (c) 3D islands are formed with some islands growing in size and generating defects. After overgrowth (d) these islands remain and represent a source for dislocations deteriorating the device performance.

FIG. 3

Formation of 3D islands according to an embodiment of the present invention. On a surface of a single crystalline substrate (i) a wetting layer of a second material (filled circles) is formed (ii). This layer is not lattice mismatched to the substrate or, if mismatched, its thickness is below the critical thickness and thus the layer is stable with respect to formation of 3D islands with their following ripening. When the layer of a third material having a stronger binding energy with the substrate material (cross-hatched circles) is deposited (iii) it trends to replace the initial layer of the second material to have the maximum number of stronger bonds between the atoms to be created, while leaving the dangling bonds of the atoms of the material with a weaker binding energy unsaturated.

FIG. 4

Epitaxial growth sequence according to the present invention. (a) A stable epitaxial layer of a material 2 is formed on the crystal surface of a material 1. (b) The structure is covered by a material 3 having a stronger binding energy with the atoms of the substrate. (c) Material 3 replaces the underlying material 2 causing 3D islands of the material 2 to form. These islands are formed at a layer thickness below the critical one and do not undergo ripening. (d) Once the structure is covered with epitaxial layer of material 4 the islands of material 2 remain defect-free.

FIG. 5

Demonstration of a possible formation mechanism of 3D islands of material 2 after the deposition of a layer of material 3. (a) A local fluctuation in the thickness of the layers of materials 2 and/or 3 enhances the exchange reactions. (b) Islands of material 2 are formed separated by the film of material 3. (c) Islands after the overgrowth by material 4.

FIG. 6

Different surface patterns may be formed. (a) A cross section of a structure containing islands of material 2. (b) A plan view of the buried islands of material (2) forming dots embedded in a matrix. (c) A plan view of the buried islands of material 2 forming wires embedded in a matrix.

FIG. 7

Arrays of 3D islands can be stacked in an uncorrelated (a), vertically-correlated (b) or anti-correlated (c) way.

FIG. 8

An example of application of an array of 3D islands in a vertical cavity surface-emitting laser.

FIG. 9

An example materials system: on a GaAs substrate a subcritical deposition of InAs is followed by deposition of AlAs. (a) A schematic view of a layer-like structure of InAs of subcritical thickness deposited on GaAs substrate. (b) A schematic view of a layer-like "sandwich" of 3 materials, AlAs on top of InAs on top of GaAs. (c) A schematic view of a structure formed as a result of the instability of a layer-like "sandwich" of FIG. 9(b). (d) A schematic view of a structure of FIG. 9(c) further capped by GaAs resulting in capped quantum dots.

DETAILED DESCRIPTION OF THE INVENTION

Three-dimensional (3D) nanostructures are presently widely used in devices of micro- and optoelectronics such as light-emitting diodes, lasers, infrared detectors and storage devices. In many cases 3D nanostructures used in nanophotonic and nanoelectronic devices are based on strained nanoislands spontaneously formed on semiconductor surface using lattice-mismatched growth.

In FIG. 1 prior art way of formation of three-dimensional nanostructures using Stranski-Krastanow growth is shown. In this approach a layer (120) is grown on a surface of lattice-mismatched single crystal substrate (110). Once the critical thickness is reached, coherently strained 3D islands (124) become energetically favorable and form on top of the residual wetting layer (122). For a given volume of a strained material exceeding a certain critical volume, it is energetically favorable for a material in a planar film to form 3D islands, wherein an energy relief due to partial strain energy relaxation overcompensates the energy cost needed for the formation of a larger surface. Eventual accumulation of the material of many islands in one island is energetically favorable as the energy relaxation energy remains the same and the surface energy reduces due to reduction in the overall surface. Thus, once strained 3D islands are formed, the system exhibits the thermodynamic driving force towards ripening, also even in case where intermediate metastable ordered phases are formed. Furthermore, large island becomes plastically relaxed with a more complete relaxation of the elastic energy as compared to metastable coherent islands.

Figure 2:
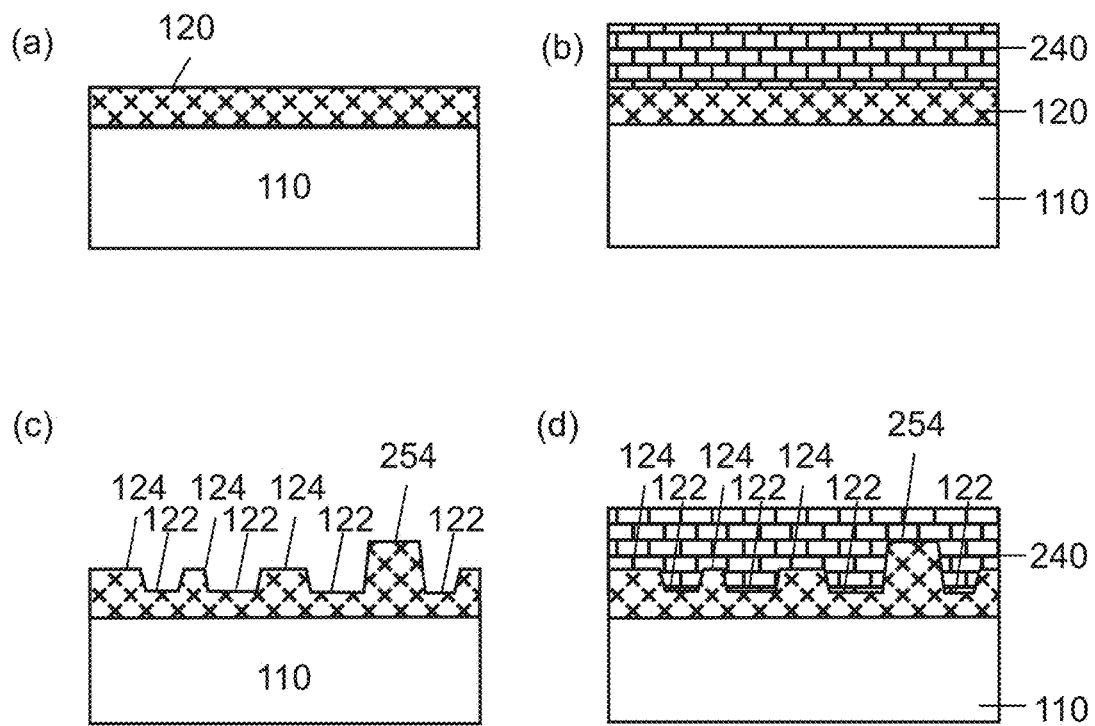

It is also known that in prior art Stranski-Krastanow growth (see FIG. 2) before the critical thickness is reached (FIG. 2(*a*)), a layer (120) of epitaxial material lattice mismatched to the underlying substrate (110) material having a thickness below the critical one remains stable. This is true also when the layer appears to be capped with a material (240) (FIG. 2(*b*)) lattice matched to the substrate material. In many practical cases the capping material used is the same as the substrate material. No defects are formed. As opposite, once the critical thickness is reached, 3D islands (124) are formed and some islands are quickly growing in size (254) and become dislocated generating defects. After overgrowth by material (the overgrowth by material (240) is shown) these islands (254) remain dislocated and represent a source for further dislocations deteriorating the device performance at high drive currents and operation temperatures.

Figure 3:
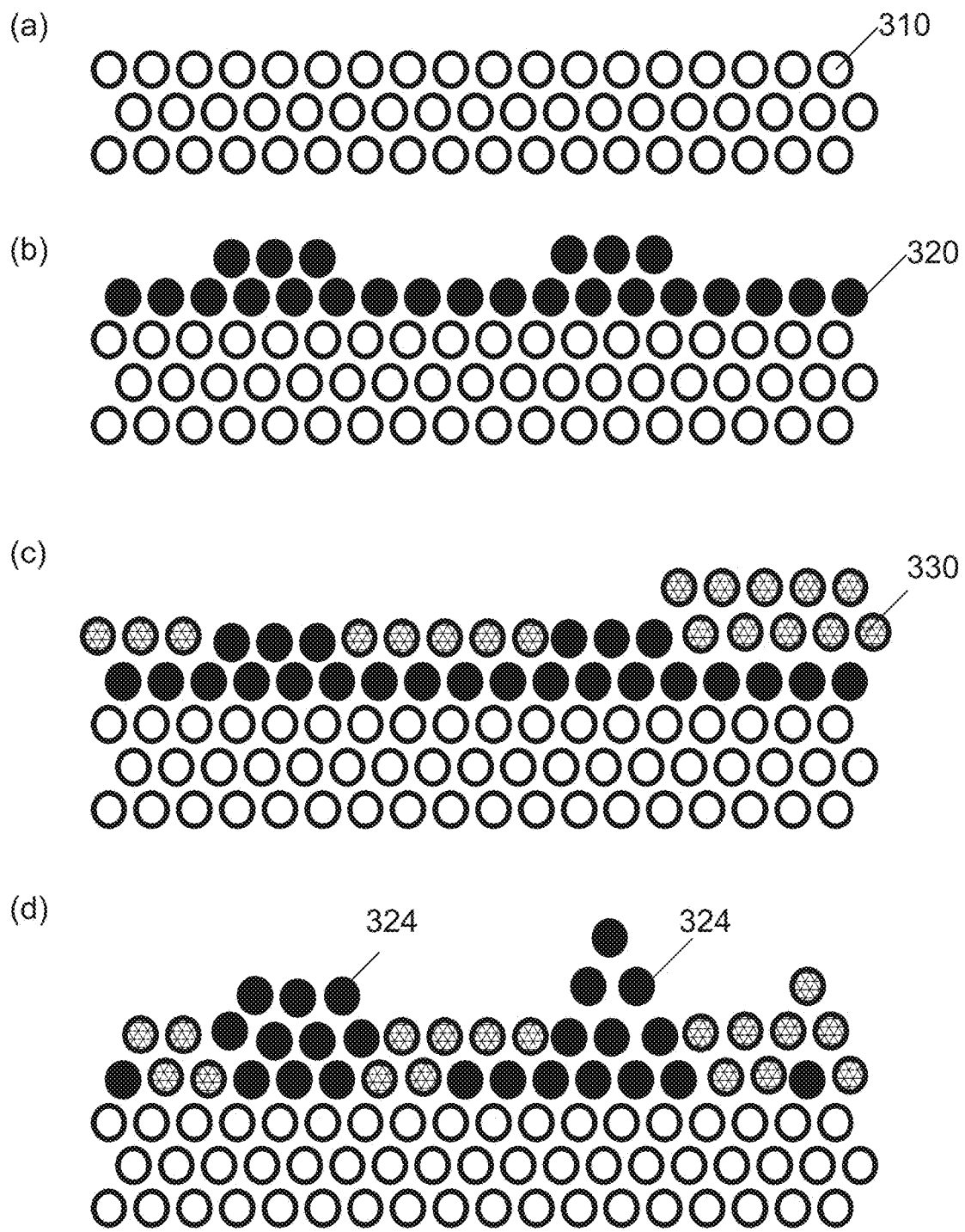

However, such a situation can be avoided. Formation of 3D islands according to an embodiment of the present invention is shown in FIG. 3. On a surface (310) of a single crystalline substrate (a) a wetting layer of a different material (320) (closed circles) is formed (b). This layer is not lattice mismatched to the substrate or, if mismatched, its thickness is below the critical thickness and thus the layer is stable with respect to the formation of 3D islands and their subsequent ripening. When a layer of a third material (330) having a stronger binding energy with the substrate material (cross-hatched circles) is deposited (c) it trends to replace the initial layer of the second material to have the maximum number of stronger bonds between the atoms to be created, while leaving the dangling bonds of the atoms of the material with a weaker binding energy unsaturated. Dangling bonds of the weaker bound material increase the total energy of the system weaker as compared to the dangling bonds of the material having a larger bonding energy.

A good estimate for the proper combination of materials is the enthalpy of formation. For example the enthalpy of formation of AlAs is much higher than the enthalpy of formation of InAs (as described in detail in the monograph by V. A. Shchukin, et al. "Epitaxy of Nanostructures", Chapter 2, Springer, Berlin, (2003), wherein this monograph is herein introduced by reference). Thus a thin layer of InAs on GaAs surface may be effectively replaced by AlAs layer with "effective" InAs molecules being redistributed over the surface with formation of 3D islands (324) even in case where these islands have a relatively high surface energy and under other conditions are energetically unfavorable. For production of coherent nanostructures it is important that there is no driving force for ripening of such islands. As opposite if the AlAs layer would be removed, the islands would disappear by the formation of a wetting layer on the GaAs surface.

A one skilled in the art will appreciate that the formation of 3D islands of the third material as illustrated in FIG. 3 is related to an instability of a uniform three-materials "sandwich", wherein a flat layer of the third materials forms on top of a flat layer of the second material, which forms on the substrate of the first material. A one driving force of such instability as described above is a larger binding energy of the third material to the substrate than the binding energy of the second material to the substrate.

An alternative driving force of instability of a flat three-material "sandwich" structure is related to wetting/non-wetting effects for the third material deposited on top of the second material. Such instability occurs if the third material does not wet the second material, i. e.

$$\gamma_3^{surface} + \gamma_{32}^{interface} > \gamma_2^{surface}. \quad (1)$$

Here $\gamma_3^{surface}$ is the surface energy of the third material, $\gamma_2^{surface}$ is the surface energy of the second material, and $\gamma_{32}^{interface}$ is the energy of the interface between the third and the second materials.

A one skilled in the art will appreciate that the instability will also occur, if both driving forces are present in the same system.

Figure 4:
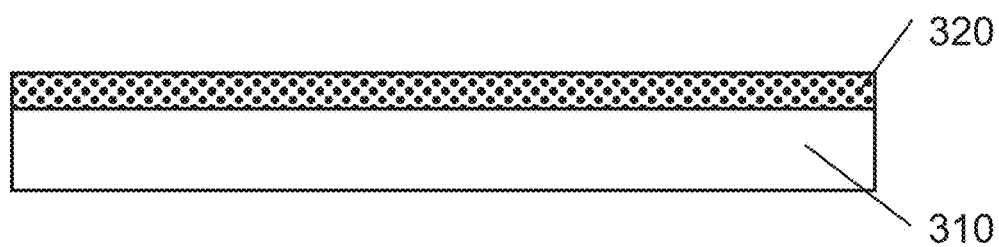
Figure 4:
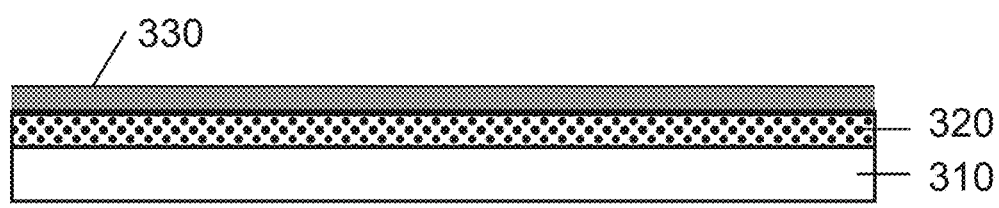
Figure 4:
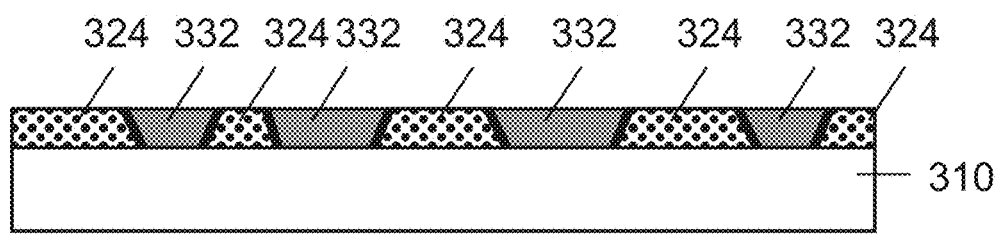
Figure 4:
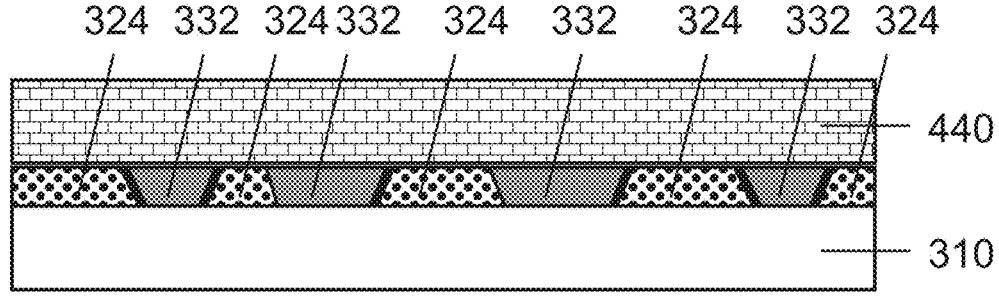

The epitaxial growth sequence according to the present invention is presented in FIG. 4. A stable epitaxial layer of a second material (320) is formed on the crystal substrate surface of a first material (310). It is covered by a third material (330) having a stronger binding energy with the atoms of the substrate (310) and replaces the underlying second material (320) causing 3D (324) islands to form, the islands being separated by the fractions (332) of the third material. The islands (324) are formed at a layer thickness of the second material which is below the critical thickness for strain-relaxation-induced formation of 3D Stranski-Krastanow islands. Therefore these islands do not undergo ripening. Once covered with epitaxial layer of the fourth material (440), the islands (324) remain defect-free.

A similar growth sequence can also occur in a materials system, in which the film of the third material on top of the second material is unstable due to non-wetting.

Figure 5:
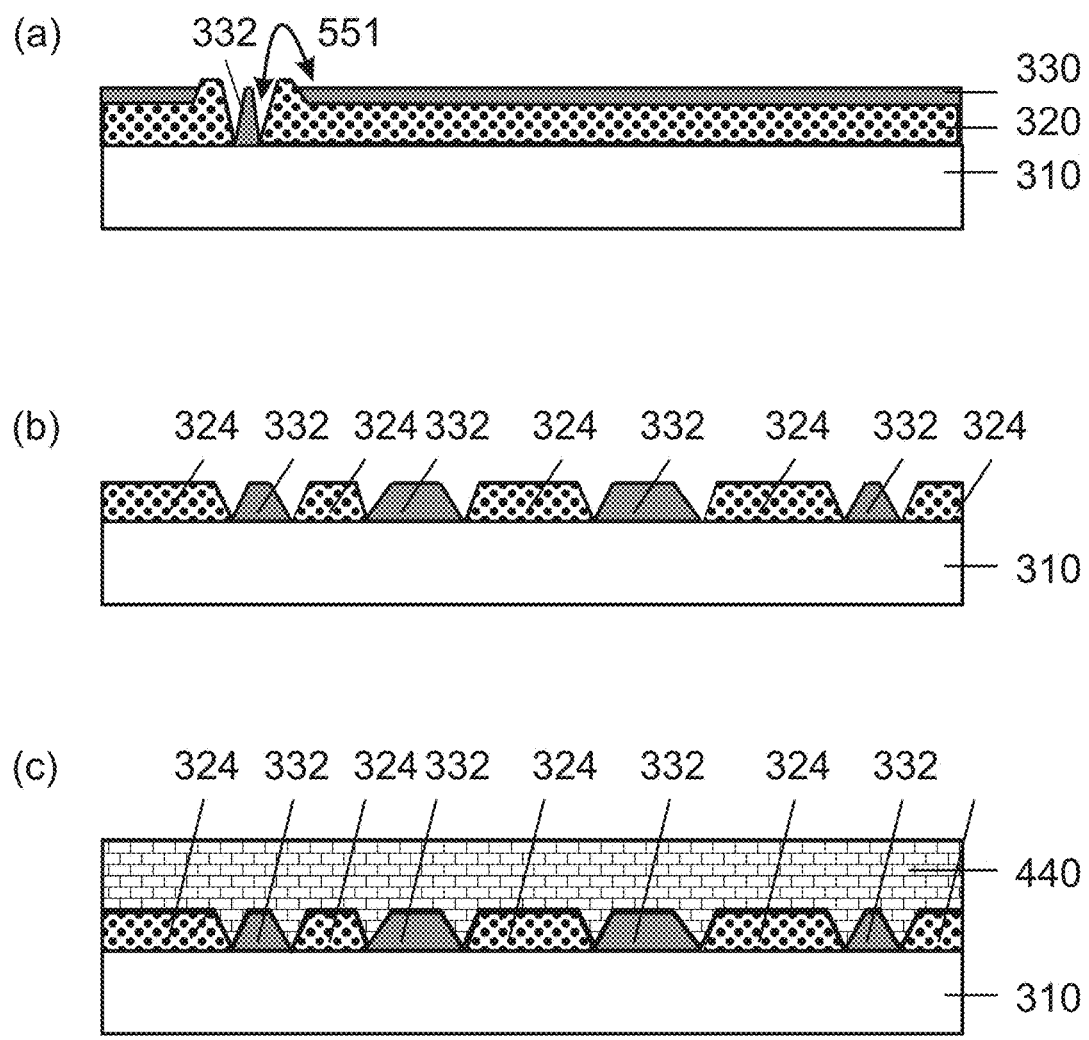

Another possible formation mechanism of 3D islands after the deposition of a layer (330) of the third material is shown in FIG. 5. Any fluctuation in the thickness of the layer (320) causes a chain of atom replacement reactions (551), as shown in FIG. 5(a). This leads to the most energetically favorable arrangement of the islands (324), (FIG. 5(b)), and the islands remain coherent also after overgrowth (FIG. 5(c)).

Figure 6:
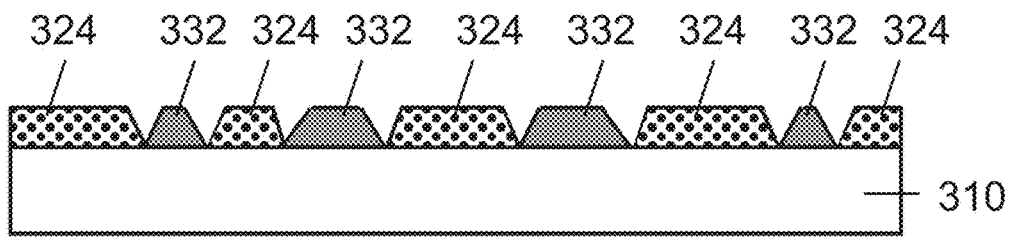
Figure 6:
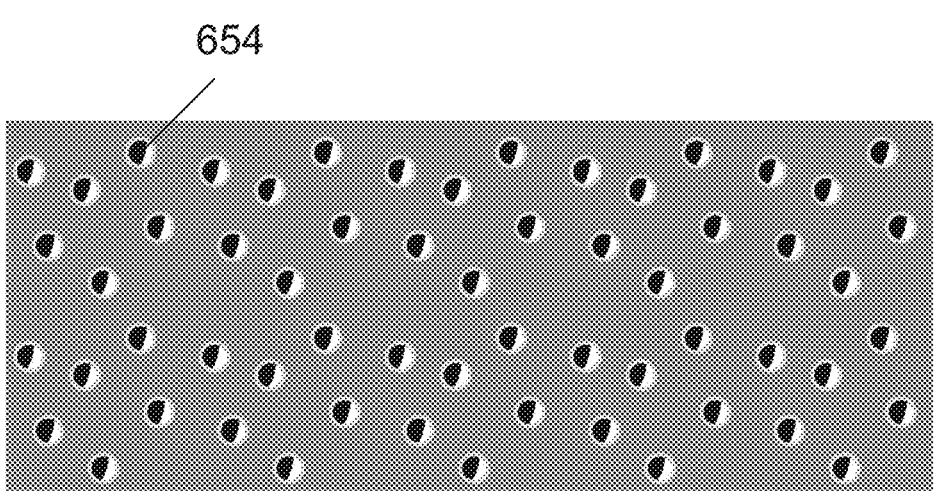
Figure 6:
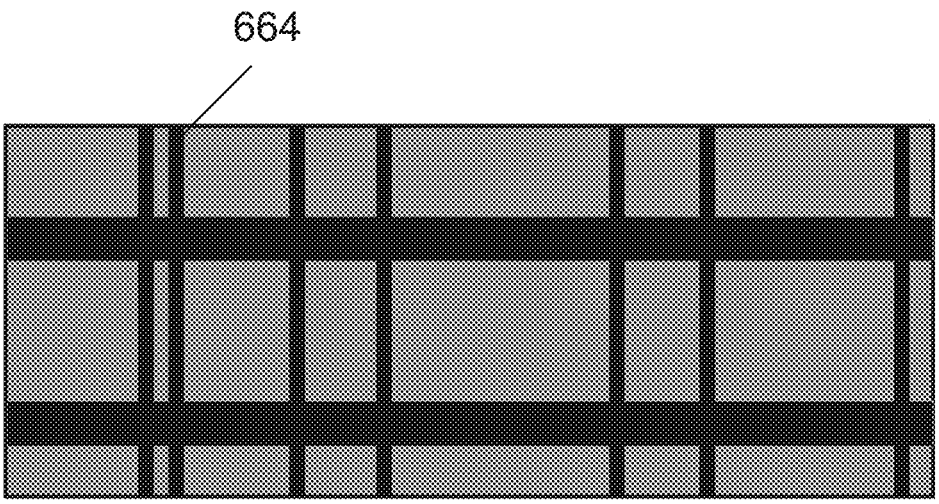

Within the described mechanisms, different surface patterns may be formed, as it is shown in FIG. 6. FIG. 6(a) represents schematically 3D islands (324) of material 2 surrounded by material 3 (332). FIG. 6(b) shows the plan view of the structure related to a situation where material 2 forms compact islands (654) having comparable dimensions in both lateral directions and thus having the shape of dots. FIG. 6(c) refers to the situation, where material 2 forms elongated objects having the shape of the wires (664).

Figure 7:
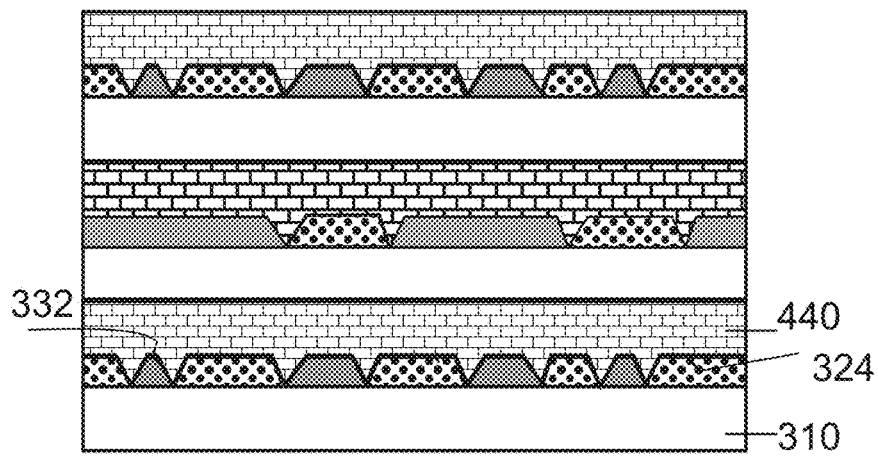
Figure 7:
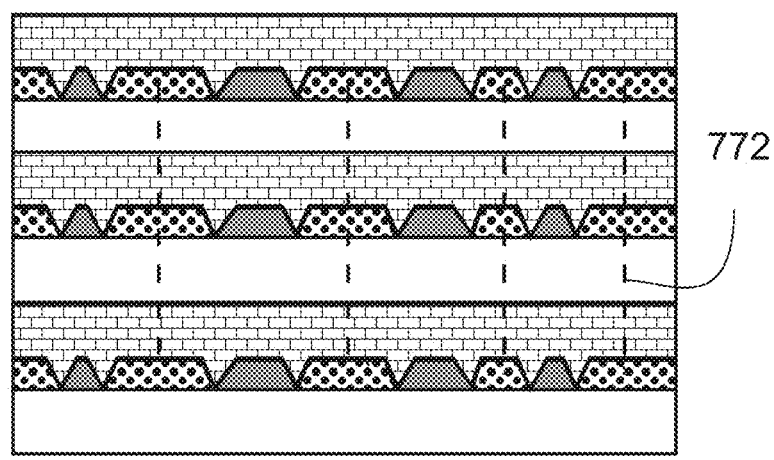
Figure 7:
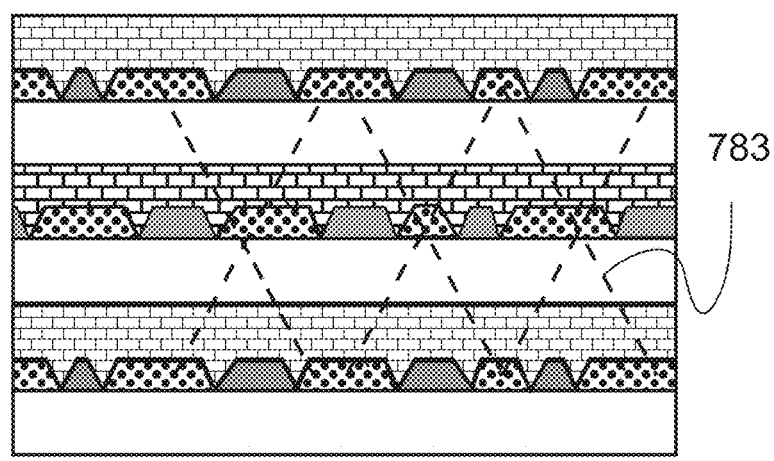

Formation of 3D islands as disclosed can be repeated, and islands can form vertically stacked structures as shown in FIG. 7. Various arrangements are possible. FIG. 7(a) shows a multi-sheet array (760) of non-correlated islands. FIG. 7(b) refers to a multi-sheet array (770) of vertically correlated islands, where the vertical correlation is illustrated by vertical eye guide lines (772). Such an arrangement can also be called in-phase correlation. An array of vertically anticorrelated islands (780) is depicted in FIG. 7(c), in which vertical anticorrelation is illustrated by tilted eye guide lines (783). Such an arrangement can also be called out-of-phase correlation.

Figure 8:
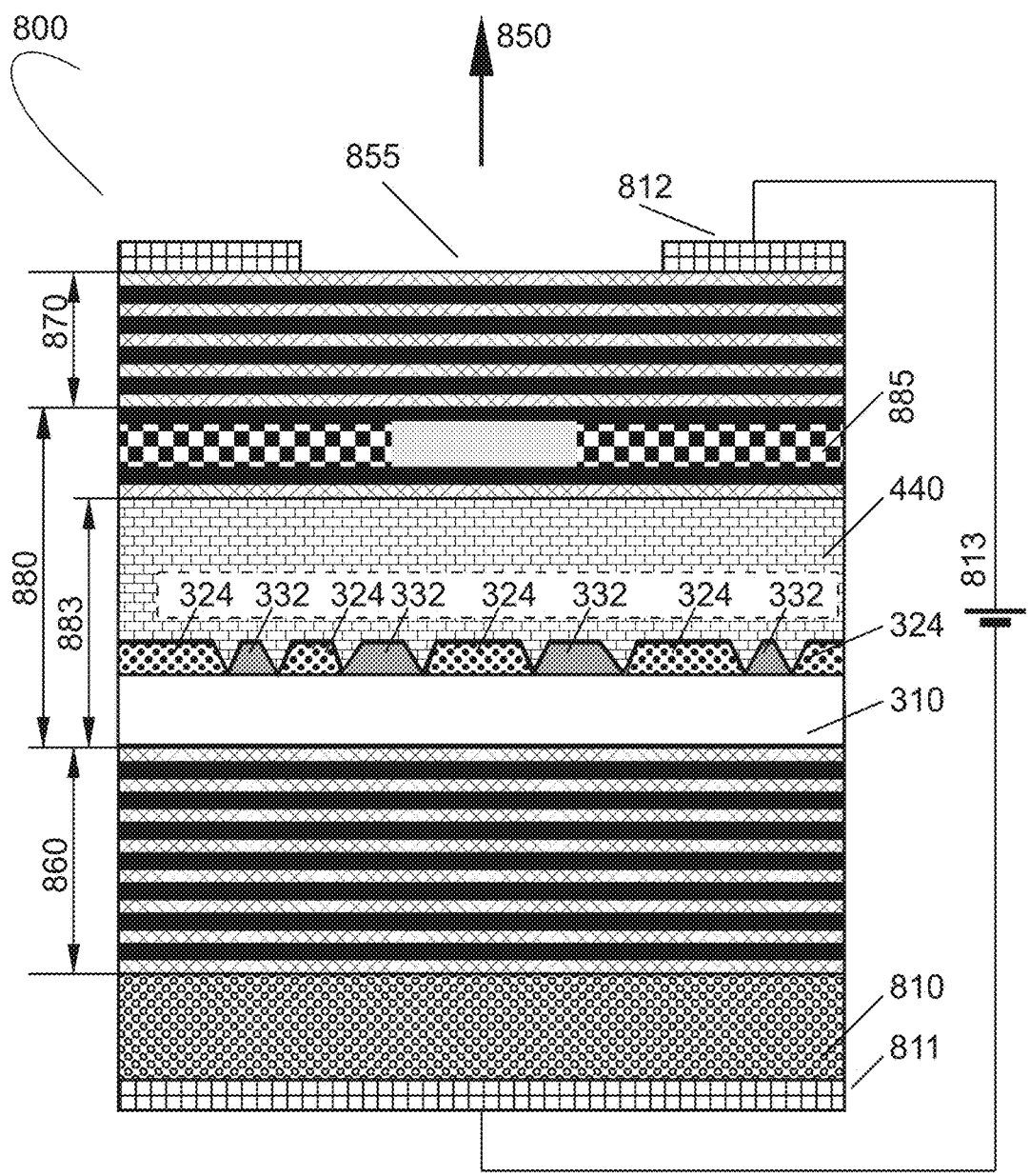

One of the embodiments of the present invention is a vertical cavity surface emitting laser (800) as shown in FIG. 8, in which 3D islands are used as an active medium (883). The active medium (883) is formed in an epitaxial growth process by the growth of the first material (310), deposition of the second material on top of the first material, subsequent deposition of the third material forcing formation of the islands (324) of the second material separated by the third material (332), and subsequent capping by the fourth material (440). The active medium is placed within the cavity (880). The cavity (880) is sandwiched between the bottom, preferably n-doped distributed Bragg reflector (DBR) (860) and the top, preferably p-doped DBR (870). Apertures (885) defining the flow of the electrical current through the active medium are formed due to the oxidation of the layers of AlAs or layers of AlGaAs having a high composition of Aluminum. The forward bias (813) is applied to the active medium (883) via the bottom n-contact (811) and the top p-contact (812). The laser light generated by the device comes out (850) through the optical aperture (855).

In another embodiment of the present invention the active medium contains multiple sheets of 3D islands, in accordance with FIGS. 7(a) through 7(c).

In yet another embodiment of the present invention the 3D islands are employed as an active medium in an edge-emitting laser.

In a further embodiment of the present invention the 3D islands are used as an active medium of a tilted wave laser disclosed in the US patents "EXTERNAL CAVITY OPTO-ELECTRONIC DEVICE", U.S. Pat. No. 7,421,001, filed Jun. 16, 2006, issued Sep. 2, 2008, and "OPTOELECTRONIC DEVICE AND METHOD OF MAKING SAME", U.S. Pat. No. 7,583,712, filed Jan. 3, 2007, issued Sep. 1, 2009, both by the inventors of the present inventions, wherein both patents are introduced herein by reference.

In another embodiment of the present invention, the 3D islands are used as an active medium of a tilted cavity laser disclosed in the US patent "TILTED CAVITY SEMICONDUCTOR LASER (TCSL) AND METHOD OF MAKING SAME", U.S. Pat. No. 7,031,360, filed Feb. 12, 2002, issued Apr. 18, 2006, by the inventors of the present invention, wherein the patent is introduced herein by reference.

A one skilled in the art will appreciate that the active medium based on the 3D islands disclosed can be employed in a light emitting diode.

One another embodiment of the present invention includes the array of 3D islands as an active medium of a disk laser.

In yet another embodiment of the present invention the active medium based on an array of 3D islands is used in a single photon emitter.

A further embodiment of the present invention includes an emitter of entangled photons using an array of 3D islands as an active medium.

Another group of the embodiments of the present invention consists of electronic devices using arrays of three dimensional islands as disclosed. The possible devices include, but are not limited to quantum dot memory device, resonant tunneling device, Coulomb blockade device, and spintronic device.

Yet another embodiment includes an electronic or an optoelectronic device, wherein the 3D islands formed according to the present invention form, after capping, anti-dots creating a repulsive potential to carriers.

In yet another embodiment, the 3D islands are elongated and form, after capping, anti-wires creating a repulsive potential for carriers.

A one skilled in the art will appreciate that the materials combination GaAs/InAs/AlAs is an example combination of materials for which the proposed growth mechanism should occur. The relation between the surface energies of AlAs, GaAs, and InAs are summarized, e.g. in the journal publication by S. Mirbt et al., "A general rule for surface reconstructions of III-V semiconductors", Surface Science, volume 422, pages L177-L182 (1999), wherein this publication is introduced herein by reference. It is shown in this publication that $$\gamma_{AlAs}^{surface} > \gamma_{InAs}^{surface}. \quad (2)$$

As a typical difference in surface energies between AlAs and GaAs, between GaAs and InAs, between AlAs and InAs exceeds 10 meV/Å$^2$, (ten milli electron Volt per Angstrom squared) and typical interface energies for III-V materials are of the value close to 1 meV/Å$^2$ (as is shown in the journal publication of N. E. Christensen "Stability of GaAs/AlAs superlattices", Solid State Communications, volume 68, issue 10, pages 959-962 (1988), wherein this publication is introduced herein by reference), then the criterion (1) holds for the deposition of AlAs on top of InAs. This means that material AlAs does not wet InAs, and the proposed mechanism is indeed expected to occur for GaAs/InAs/AlAs deposition.

As for the growth of InAs on the (001) surface of GaAs where the critical thickness for the formation of 3D islands is about 1.7 monolayers, then the preferred thickness of InAs deposition for the mechanism disclosed in the present invention is below 1.7 monolayers. (For the growth of III-V semiconductor materials the counting of 1 monolayer conventionally means 1 atomic layer of cations and 1 atomic layer of anions.)

Figure 9:
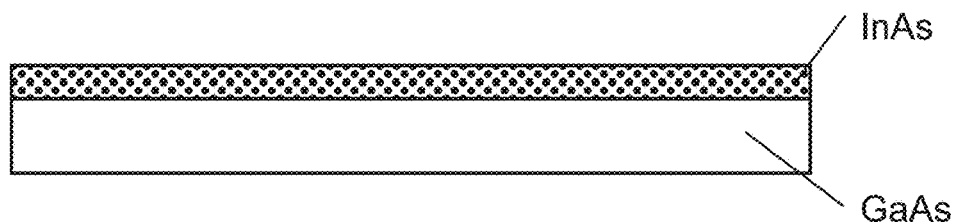
Figure 9:
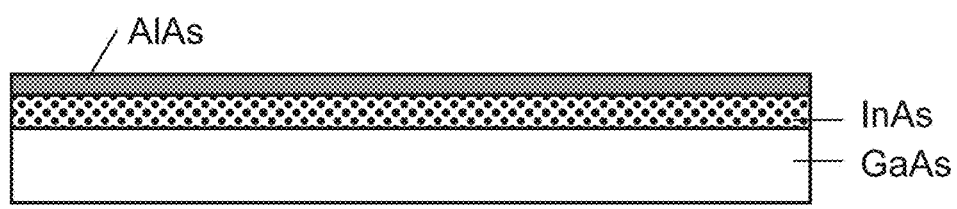
Figure 9:
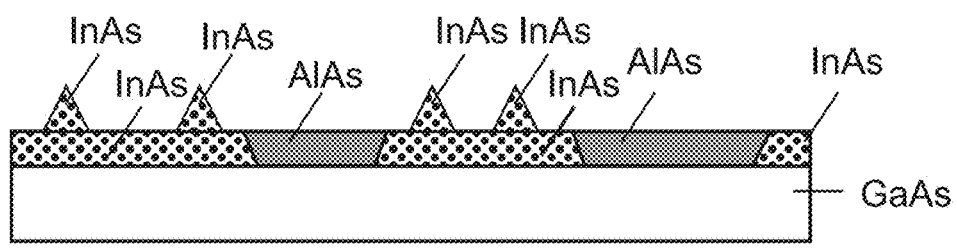
Figure 9:
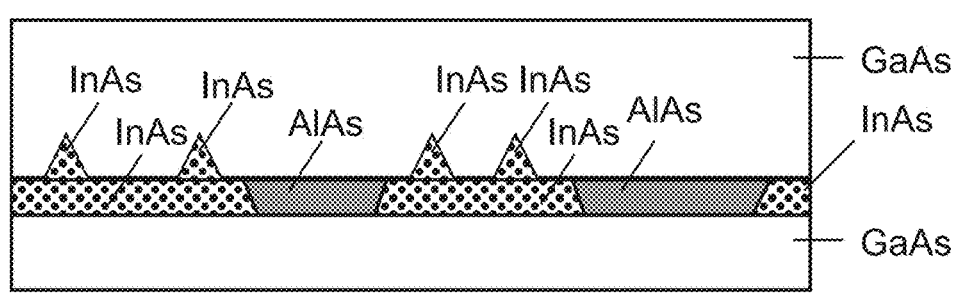

FIG. 9 illustrates the formation mechanism of the quantum dots for GaAs/InAs/AlAs materials system. FIG. 9(a) shows a layer of InAs deposited on GaAs substrate. The thickness of InAs layer is below the critical thickness for the formation of 3D islands. FIG. 9(b) shows schematically a layer of AlAs deposited on top of InAs/GaAs structure. FIG. 9(c) shows the structure formed as the result of instability of a flat "sandwich" of FIG. 9(b), revealing AlAs-rich domains on GaAs, and InAs-rich domains. As the local thickness of InAs-rich domains exceeds the initial nominal thickness of the deposited InAs, the 3D islands of InAs form. FIG. 9(d) shows the structure of FIG. 9(c) after capping by GaAs revealing InAs quantum dots.

Depending on particular growth conditions, an unstable "sandwich" of three materials like in FIG. 9(b) may or may not form. Three-dimensional islands of InAs can form immediately in the process of the deposition of AlAs.

A one skilled in the art will appreciate that domains of a layer and islands shown as consisting of pure InAs and AlAs may also contain an alloy due to intermixing of both deposited materials with each other and/or with GaAs substrate.

The relation (2) also holds for the subsequent deposition of InAs and then of AlAs on other substrates than GaAs, e.g. on InP. Thus the proposed mechanism for the formation of 3D islands and, after capping, for the formation of quantum dots, will also occur for the InP/InAs/AlAs system.

It will be also appreciated by one skilled in the art that the relation (2) between surface energies corresponds to a general chemical trend. Once two materials differ by one chemical element, and the two different chemical elements corresponding to two materials belong to the same group of the periodic system of elements, than the material containing the element with a lower number will have a larger bonding energy in the bulk and, correspondingly, a larger surface energy. Therefore, a similar growth mechanism is expected to occur for GaN substrates and the subsequent deposition of subcritical thickness of InN followed by the deposition of AlN. Another possibility includes using a substrate of GaN, depositing $Ga_{1-x}In_xN$ as a second material, and $Ga_{1-y}Al_yN$ as a third material. Further materials combinations are possible as well.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. A method for fabrication of three-dimensional nanostructures on top of the surface of a first solid state material, which includes steps of
   (a) deposition of a layer of a second solid state material, to form a stable layer-like coverage of the surface of said first solid state material and
   (b) the subsequent deposition of a third solid state material,
      wherein a layer-like coverage of said third solid state material on top of said layer-like coverage of second solid state material is unstable,
   wherein as a result of said instability said third solid state material replaces said second solid state material reducing the total energy of the system, and
   wherein the resulting excess volume of said second solid state material forms three-dimensional nanostructures.

2. The method of claim 1,
   wherein said instability is governed by a driving force selected from the following group:
      (i) a binding energy of said third solid state material with said first solid state material is larger than the binding energy of said second solid state material with said first solid state material,
      (ii) said third solid state material does not wet said second solid state material, and
      (iii) a combination of (i) and (ii).

3. The method of claim 1,
   wherein the resulting nanostructure is covered by an additional layer of a fourth solid state material.

4. The method of claim 3,
   wherein the procedure described in claims 1 and 3 is repeated two or more times.

5. The method of claim 1,
wherein the deposited said second solid state material and said third solid state material are lattice matched to said first solid state material.

6. The method of claim 1,
wherein at least one material from the group consisting of
   a) said second solid state material and
   b) said third solid state material
is lattice mismatched to said first solid state material.

7. The method of claim 3,
wherein the solid state materials forming the group consisting of
   a) said first solid state material,
   b) said second solid state material,
   c) said third solid state material, and
   d) said fourth solid state material
are selected from the group consisting of
   i) single crystalline materials,
   ii) amorphous materials, and
   iii) organic materials.

8. The method of claim 1,
wherein said second solid state material forms nanostructures selected from the group consisting of:
   a) quantum dots,
   b) quantum wires,
   c) anti-dots,
   d) anti-wires, and
   e) any combination of a) through d).

9. The method of claim 1,
wherein said solid state materials forming the group consisting of
   a) said first solid state material,
   b) said second solid state material,
   c) said third solid state material, and
   d) said fourth solid state material
are selected from the group consisting of:
   (i) III-V materials,
   (ii) III-N materials,
   (iii) II-VI materials,
   (iv) group IV materials, and
   (v) any combination of (i) through (iv).

10. The method of claim 9 wherein
said first solid state material is GaAs, and
said second solid state material is InAs, and
said third solid state material is AlAs.

11. The method of claim 9 wherein,
said first solid state material is InP, and
said second solid state material is InAs, and
said third solid state material is AlAs.

12. The method of claim 9, wherein
said first solid state material is GaN, and
said second solid state material is an alloy (In,Ga)N, and
said third solid state material is an alloy (Al,Ga)N.

13. An optoelectronic device, comprising an active medium, further comprising a three-dimensional heterostructure formed according to claim 3,
wherein said optoelectronic device is selected from the group consisting of:
   (i) light-emitting diode,
   (ii) edge-emitting laser diode,
   (iii) surface-emitting laser diode,
   (iv) tilted wave laser diode,
   (v) tilted cavity laser diode,
   (vi) semiconductor disc laser,
   (vii) single photon light emitter, and
   (viii) emitter of entangled photons.

14. An electronic device, comprising an active medium further comprising three-dimensional heterostructure formed according to claim 3,
wherein said electronic device is selected from the group consisting of:
   (i) quantum dot memory device,
   (ii) resonant tunneling device,
   (iii) Coulomb blockade device, and
   (iv) spintronic diode.

* * * * *